United States Patent
Yasukawa

(10) Patent No.: US 10,026,922 B2
(45) Date of Patent: Jul. 17, 2018

(54) DISPLAY DEVICE

(71) Applicant: Japan Display Inc., Minato-ku (JP)

(72) Inventor: Koji Yasukawa, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 11 days.

(21) Appl. No.: 15/357,354

(22) Filed: Nov. 21, 2016

(65) Prior Publication Data

US 2017/0250367 A1    Aug. 31, 2017

(30) Foreign Application Priority Data

Feb. 25, 2016  (JP) .................................. 2016-034587

(51) Int. Cl.
*H01L 51/52*  (2006.01)
*H01L 27/32*  (2006.01)

(52) U.S. Cl.
CPC ........ *H01L 51/5246* (2013.01); *H01L 27/326* (2013.01); *H01L 51/5203* (2013.01)

(58) Field of Classification Search
None
See application file for complete search history.

(56) References Cited

U.S. PATENT DOCUMENTS

| 2005/0001247 | A1* | 1/2005 | Ozawa | H01L 51/529 257/291 |
| 2011/0260180 | A1 | 10/2011 | Kuranaga et al. | |
| 2013/0181204 | A1 | 7/2013 | Kuranaga et al. | |
| 2014/0117334 | A1* | 5/2014 | Nakamura | H01L 27/322 257/40 |
| 2014/0353614 | A1* | 12/2014 | Park | H01L 27/3225 257/40 |

FOREIGN PATENT DOCUMENTS

JP    2011-227369    11/2011

* cited by examiner

*Primary Examiner* — Eva Y Montalvo
*Assistant Examiner* — Kevin Quinto
(74) *Attorney, Agent, or Firm* — Oblon, McClelland, Maier & Neustadt, L.L.P.

(57) ABSTRACT

A display device includes a plurality of pixel electrodes, an insulating layer that includes a plurality of through holes each overlapping each of the pixel electrodes and covers a periphery of each of the pixel electrodes, a light-emitting layer over at least one of the pixel electrodes, a common electrode on the insulating layer and the light-emitting layer, a sealing layer that seals the light-emitting layer and located on the common electrode, a counter substrate, and an adhesive layer that adheres the counter substrate to the sealing layer. An upper surface of the insulating layer has a first area which does not overlap the light-emitting layer in a plan view, and the adhesive layer is located at least on the first area.

16 Claims, 9 Drawing Sheets

DISPLAY DEVICE

CROSS-REFERENCE TO RELATED APPLICATION

The present application claims priority from Japanese application JP2016-034587 filed on Feb. 25, 2016, the content of which is hereby incorporated by reference into this application.

BACKGROUND OF THE INVENTION

1. Field of the Invention

The present invention relates to a display device.

2. Description of the Related Art

In recent years, display devices using a self-luminous object, such as an organic light emitting diode (OLED), have been put into practice. The display devices using a self-luminous object, such as an organic electro-luminescent (EL) display device using an OLED, is superior to a conventional liquid crystal display device in term of visibility and response speed. In addition, the display device using a self-luminous object does not require an auxiliary lighting device such as a backlight, and thus can reduce thickness. JP2011-227369A discloses a sheet display that is thinner than conventional display devices or can be bent.

When a substrate included in an organic EL display device is subjected to a force so as to bend the substrate, for example, sometimes a self-luminous object such as an OLED is caused to be delaminated so that a display area has a non-light-emitting region.

SUMMARY OF THE INVENTION

One or more embodiments of the present invention have been conceived in view of the above, and an object thereof is to provide technologies to reduce delamination of a self-luminous object, which is caused when a physical stress, such as a force, is applied to a display device.

In the invention disclosed in the present application, an outline of typical features will be described below.

A display device according to the present invention includes a plurality of pixel electrodes, an insulating layer that includes a plurality of through holes each overlapping each of the pixel electrodes and covers a periphery of each of the pixel electrodes, a light-emitting layer over at least one of the pixel electrodes, a common electrode on the insulating layer and the light-emitting layer, a sealing layer that seals the light-emitting layer and located on the common electrode, a counter substrate, and an adhesive layer that adheres the counter substrate to the sealing layer. An upper surface of the insulating layer has a first area which does not overlap the light-emitting layer in a plan view, and the adhesive layer is located at least on the first area.

According to the present invention, it is possible to reduce delamination of a self-luminous object, which is caused when a physical stress, such as a force, is applied to a display device.

DETAILED DESCRIPTION OF THE INVENTION

Figure 1:
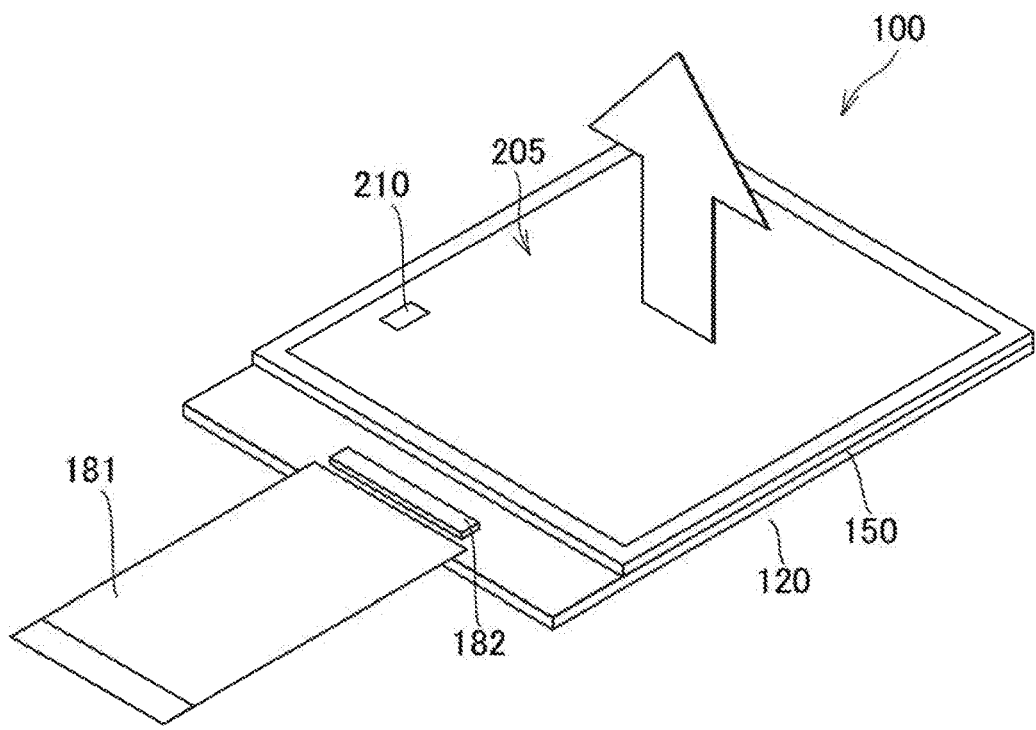
FIG. 1 is a perspective view illustrating an example of an organic EL display device according to first embodiment.

An embodiment of the present invention will be described below in detail with reference to the accompanying drawings. The elements having the same functions are designated with the same reference characters, and their overlapping explanation will be omitted. In order to simplify the description, for example, a width, a thickness, and a shape of each portion may be shown schematically in the drawings compared to a real case. However, the drawings are mere examples and do not limit an interpretation of the present invention. The following will explain an organic EL (Electro Luminescence) display device using an organic light-emitting diode (OLED), which is a type of self-luminous element, in particular an organic EL display device that constructs a sheet display.

First Embodiment

FIG. 1 is a perspective view illustrating an example of an organic EL display device according to the first embodiment of the present invention. As shown in FIG. 1, an organic EL display device 100 has two substrates, an array substrate 120 and a counter substrate 150. The counter substrate 150 opposes to the array substrate 120.

The array substrate 120 and the counter substrate 150 are substrates each composed of a sheet-like resin, for example, and include an insulating surface. On the array substrate 120, pixel circuits are disposed in a matrix. Each of pixel circuits corresponds to a pixel 210, and includes a thin film transistor (TFT). The array substrate 120 includes a driving integrated circuit 182 and a flexible printed circuit board 181 for image signal input from outside, for example. The driving integrated circuit 182 outputs a scanning signal to pixel transistors respectively included in the pixel circuits for conducting between a source and a drain of each pixel transistor, and includes a driving circuit that outputs a signal in accordance with a display tone of the pixel 210 to a sub pixel of the pixel 210. The organic EL display device 100 according to this embodiment is a top-emission organic EL display device that emits light on a side of the array substrate 120 where a light-emitting layer is formed, as indicated by an arrow in FIG. 1.

A display area 205 composed of pixels 210 arranged in a matrix is formed on the array substrate 120 and the counter substrate 150 of the organic EL display device 100. The pixels 210 in X columns and Y rows are disposed on the display area 205. Each of the pixels 210 outputs one of three or four colors, and is referred to as a sub-pixel. For example, a point included in an image is represented by adjacent pixels 210 that are different in colors from each other.

Figure 2:
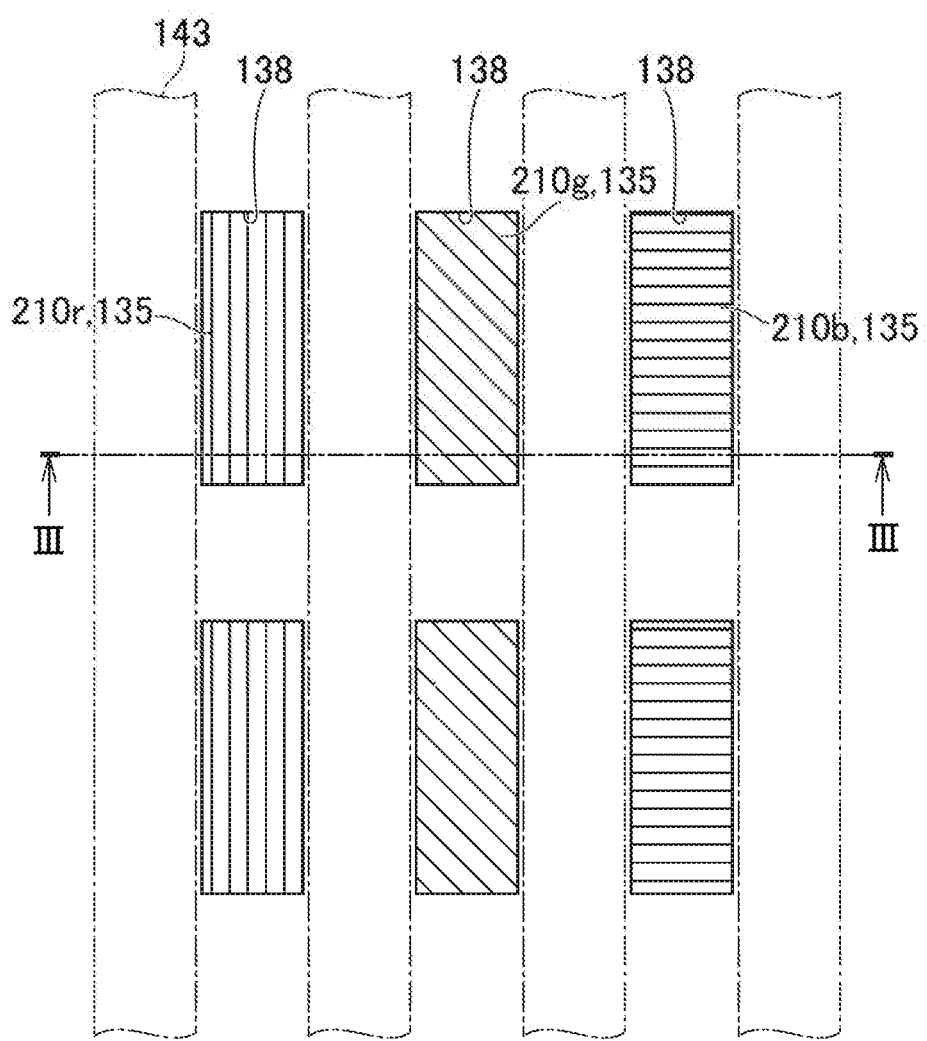
FIG. 2 is a partial plan view illustrating a configuration in a display area of the organic EL display device shown in FIG. 1.

FIG. 2 is a partial plan view illustrating a configuration in a display area 205 of the organic EL display device 100 shown in FIG. 1. In the organic EL display device 100 shown in FIG. 2, the display area 205 has a stripes arrangement in which a red pixel 210r, a green pixel 210g, and a blue pixel 210b constituting a point are aligned in a direction from left to right in FIG. 2. Each pixel 210 is rectangular. Further, organic EL films 135 constituting the red pixel 210r, the green pixel 210g, and the blue pixel 210b are disposed inside of through holes 138 respectively formed at the positions of the pixels 210r, 210g, and 210b. On the array substrate 120 side of the counter substrate 150, stripe-shaped spacers 143 are disposed so as to avoid the through holes 138 in a plan view. Details of the spacers 143 will be discussed later. The point may be composed of four square sub-pixels (red, green, blue, white), and such four sub-pixels may be arranged in 2×2 squares, for example.

Figure 3:
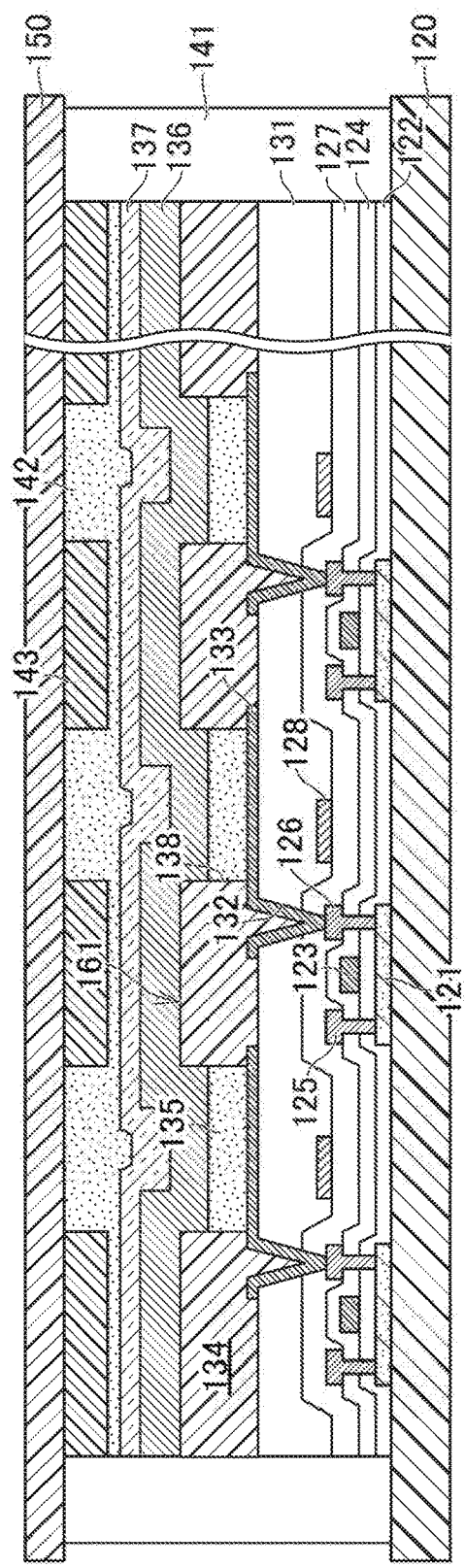
FIG. 3 is a cross-sectional view of the organic EL display device shown in FIG. 2 taken along the line III-III.

FIG. 3 is a cross-sectional view of the organic EL display device 100 shown in FIG. 2 taken along the line III-III. On the array substrate 120, the followings are sequentially laminated: a semiconductor layer including a semiconductor film 121; an interlayer insulating layer 122; a first electrode layer including gate electrodes 123; an interlayer insulating layer 124; a second electrode layer including source and drain electrodes 125 and 126; an interlayer insulating layer 127; a third electrode layer including a wiring 128; a flattening film 131 on which contact holes 132 are formed; a fourth electrode layer including pixel electrodes 133; an insulating bank 134; an organic EL layer including an organic EL film 135; a common electrode 136; and a sealing film 137. The interlayer insulating layers 122, 124, and 127 are insulating layers including, for example, silicon oxide and silicon nitride. The electrode layers from the first electrode layer to the third electrode layer are particularly required to have low resistivity, and composed of metal layers selected from, for example, molybdenum (Mo), titanium (Ti), and aluminum (Al), or laminates thereof. The fourth electrode layer is determined in view of, for example, a work function for driving the organic EL film 135, and is composed of oxide conductive materials selected from indium tin oxide (ITO), indium zinc oxide (IZO), and zinc oxide (ZnO), for example. In a case of top emission, the fourth electrode layer may be a reflective layer that reflects light and have a layer of silver (Ag) and Al, for example. In the insulating bank 134, a through hole 138 is formed for each pixel 210. A base film composed of an inorganic insulator may be located between the semiconductor layer and the array substrate 120.

The spacers 143 are located on the array substrate 120 side of the counter substrate 150. A filler 142 is located between the counter substrate 150 or the spacers 143 and the sealing film 137 stacked on the array substrate 120. In other words, the filler 142 is located on the entire upper surface of the insulating bank 134. The filler 142 is used as an adhesive, thereby the array substrate 120 and the counter substrate 150 are adhered together. Here, the spacers 143 are stripe-shaped in a plan view, and thus air can be escaped in a direction of stripes when the array substrate 120 and the counter substrate 150 are adhered together. As such, it is possible to prevent air bubbles from being formed in the filler 142. Further, between the array substrate 120 and the counter substrate 150, a sealing material 141 is located in an outer peripheral area. The sealing material 141 prevents the layers, including from the semiconductor layer to the sealing film 137, the filler 142, and the spacers 143 from being exposed to the open air.

In this embodiment, organic EL elements in the display area 205 are divided into groups respectively emitting light in red, blue, and green colors, although a full-color display may be provided by a combination of organic EL elements that emit white color and color filters. In this case, color filters may be located between the counter substrate 150 and the spacers 143.

A plurality of pixel circuits arranged in a matrix and respectively corresponding to the pixels 210 are located on the array substrate 120. The pixel circuits other than a part of the organic EL elements are formed on the layers including from the semiconductor layer to the wiring 128. The pixel circuits each include a thin film transistor, a pixel electrode 133, an organic EL film 135, and a common electrode 136. The common electrode 136 is also located between the pixel circuits in the display area 205, and is a film that overlaps the display area 205 in a plan view.

The thin film transistor includes a semiconductor film 121, a gate electrode 123, and drain and source electrodes 125 and 126, and directly connected to the organic EL element. The thin film transistor controls light emission of the pixel 210 that corresponds to the pixel circuit including this thin film transistor. The semiconductor film 121 and the gate electrode 123 overlap with each other in a plan view. An area where the semiconductor film 121 overlaps the gate electrode 123 is a channel region of the thin film transistor, and two areas that sandwich the region are respectively in contact with the source and drain electrodes 125 and 126 passing through the interlayer insulating layers 122 and 124.

The flattening film 131 is, for example, an acrylic resin film, and provided to cover the thin film transistor and the wiring 128. The contact holes 132 are formed on the interlayer insulating layer 127 and the flattening film 131. On the bottom surface of the contact hole 132, the upper surface of the source or drain electrode 126 is exposed from the interlayer insulating layer 127. The pixel electrode 133 is in contact with the inner periphery and the bottom of the contact hole 132, and extends to the flattening film 131.

The insulating bank 134 is made of, for example, acrylic resin, and includes multiple through holes 138. The through holes 138, a pixel electrode 133, and an organic EL film 135 are located in each pixel circuit. The bottom of through hole 138 extend to the pixel electrode 133. The insulating bank 134 also covers a periphery of the pixel electrode 133. The organic EL film 135 is located so as to avoid the inside of the through hole 138 and the entire upper surface of the insulating bank 134. The organic EL film 135 is stacked on at least a part of the pixel electrode 133 disposed on the flattening film 131. The organic EL film 135 includes a hole injection layer, a hole transport layer, a light-emitting layer, an electron transport layer, and an electron injection layer. In a case where the pixel electrode 133 is an anode, the organic EL film 135 has the hole injection layer, the hole transport layer, the light-emitting layer, the electron transport layer, and the electron injection layer which are sequentially stacked by vapor deposition using a fine metal mask. In a case where the pixel electrode 133 is a cathode, these layers included in the organic EL film 135 may be stacked in reverse order.

The common electrode 136 is stacked on the organic EL film 135 and the insulating bank 134. The common electrode 136 is, for example, a transparent conductive film such as an ITO. In a case of bottom-emission type, a reflective metal layer may be included. The lower surface of the common electrode 136 is in contact with the upper surface of the organic EL film 135 in the through hole 138 and the upper surface of the insulating bank 134 in the vicinity of the organic EL film 135 in a plan view. The sealing film 137 is located on the common electrode 136 and seals the organic EL element, thereby preventing, for example, moisture ingress to the organic EL film 135. The organic EL element is composed of a pixel electrode 133, an organic EL film 135, and a common electrode 136.

The spacers 143 are disposed so as to avoid multiple through holes 138 in a plan view, and oppose to the first area 161, which is a part of the upper surface of the insulating bank 134. The material of the spacers 143 is the same as that of the insulating bank 134, but may be similar resin. The spacers 143 extend in a first direction in a plan view, and are disposed in alignment in a second direction that intersects the first direction. In a plan view, a through hole 138 disposed between adjacent spacers 143. The spacers 143 do not overlap the organic EL film 135. The spacers 143 form protrusions below the counter substrate 150 (array substrate 120 side). The adhesive filler 142 is filled between the layer of the spacers 143 and the sealing film 137.

In a general organic EL display device, even when the light-emitting layers of the organic EL film 135 are made differently according to luminescent colors (RGB) of the pixel 210, the hole injection layer, the hole transport layer, and the electron transport layer are formed on the entire display area 205 by vapor deposition without using a fine metal mask. On the other hand, the layers included in the organic EL film 135 are easily delaminated compared to other layers. In particular, this problem will be particularly noticeable in a case where such layers are formed by vapor deposition.

In this embodiment, there is a first area 161 that has no organic EL film 135 in a plan view, and thus in the first area 161, the insulating bank 134 on the array substrate 120 is adhered to the counter substrate 150 not through the organic EL film 135, but through the common electrode 136, the sealing film 137, the filler 142, and the spacer 143. Further, a space between the spacers 143 and the sealing film 137 is narrow, and this causes the sealing film 137 and the spacers 143 to be strongly adhered to each other compared to the sealing film 137 on the organic EL film 135 and the counter substrate 150. Then, for example, the force associated with bending the organic EL display device 100 is applied mainly to the insulating bank 134 in the first area 161, and thus the force applied to the organic EL film 135 is significantly reduced. This can prevent the organic EL film 135 from being delaminated.

Figure 4:
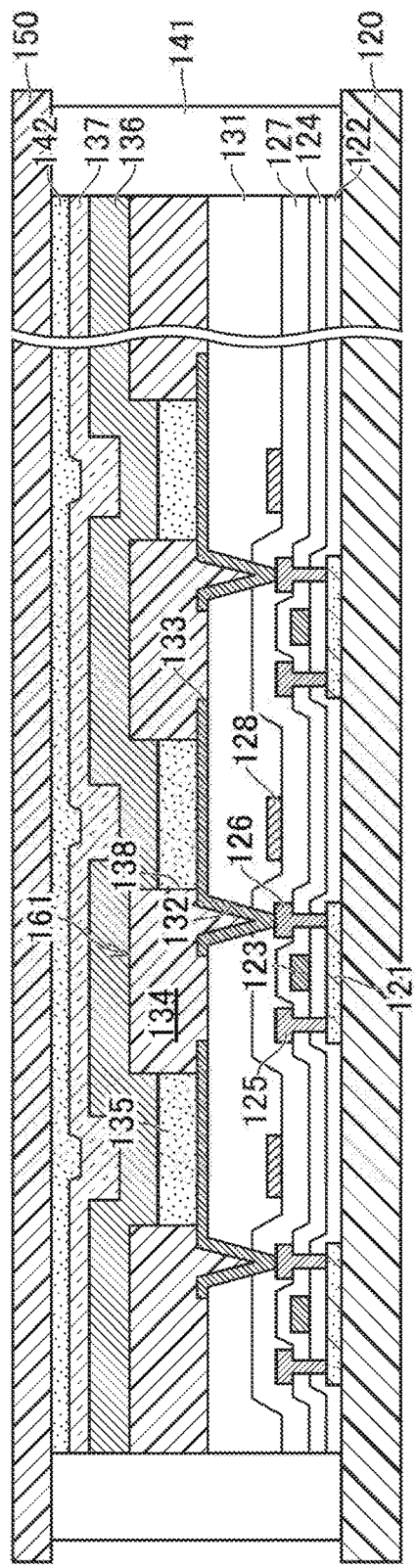
FIG. 4 is a cross-sectional view illustrating one of the other examples of the organic EL display device.

FIG. 4 is a cross-sectional view illustrating one of the other examples of the organic EL display device 100. Unlike the example of FIG. 3, the example of FIG. 4 has no spacer 143. However, similarly to the example of FIG. 3, the insulating bank 134 on the array substrate 120 is also adhered to the counter substrate 150 not through the organic EL film 135 in the first area 161. In FIG. 4, a difference in adhesive strength is small between of the first area 161 and an area where the organic EL film 135 exists compared to the example of FIG. 3, and thus the force associated with, for example, bending the organic EL display device 100 is more easily applied to the organic EL film 135. However, the adhered parts prevent deformation of the organic EL film 135 due to bending of the organic EL display device 100, for example, thereby preventing the organic EL film 135 from being delaminated.

Figure 5:
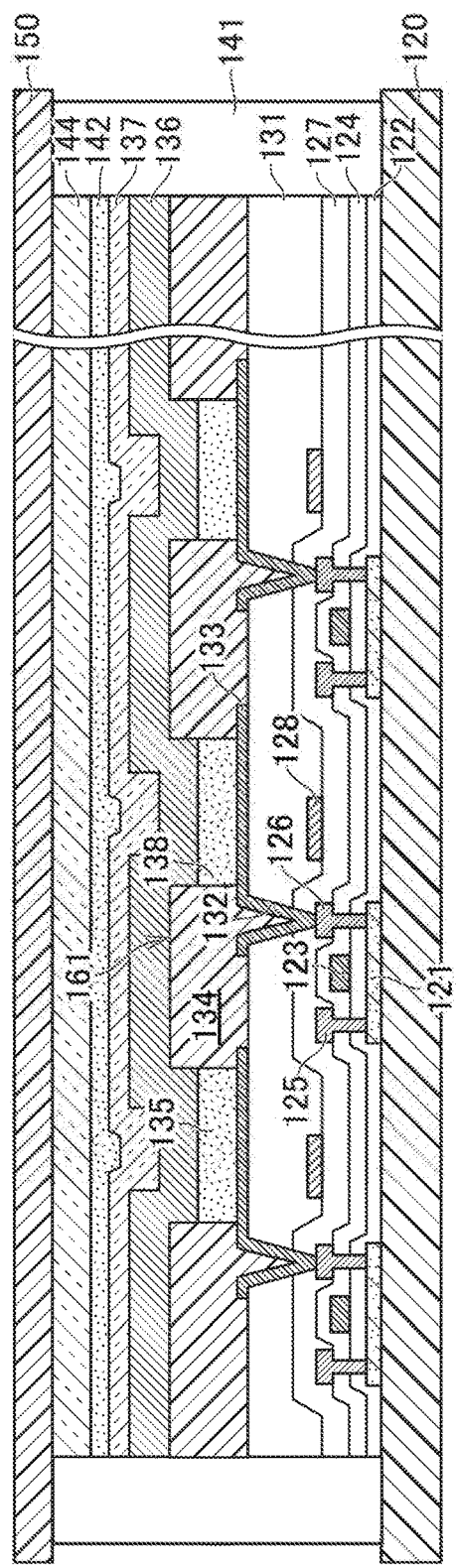
FIG. 5 is a cross-sectional view illustrating one of the other examples of the organic EL display device.

FIG. 5 is a cross-sectional view illustrating one of the other examples of the organic EL display device 100. Unlike the example of FIG. 3, in the example of FIG. 5, a transparent layer 144 is located instead of the spacers 143. The transparent layer 144 is a plate-like layer disposed between the counter substrate 150 and the filler 142, and has light-transmitting properties. Unlike the spacers 143, the transparent layer 144 is disposed so as to also overlap the center part of the organic EL film 135 in a plan view. In the example of FIG. 5, although a difference in adhesive strength between the first area 161 and an area where the organic EL film 135 exists is smaller than the example of FIG. 3, it is possible to prevent the organic EL film 135 from being delaminated more efficiently than conventional technology.

Second Embodiment

The organic EL display device 100 according to the second embodiment is different from the first embodiment in that a part of the upper surface of the insulating bank 134 is covered by the organic EL film 135. In the following, the differences between the first embodiment and the second embodiment will be mainly discussed.

Figure 6:
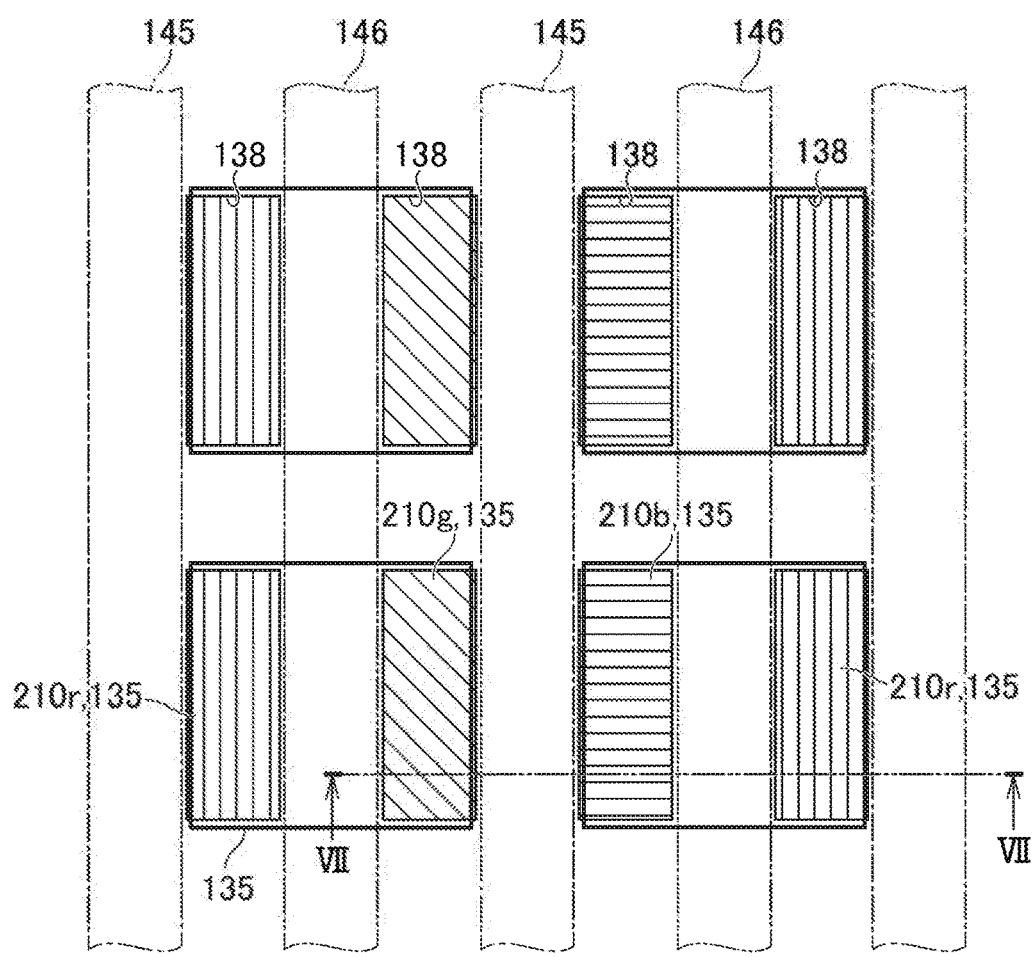
FIG. 6 is a partial plan view illustrating a configuration in a display area of the organic EL display device according to second embodiment.
Figure 7:
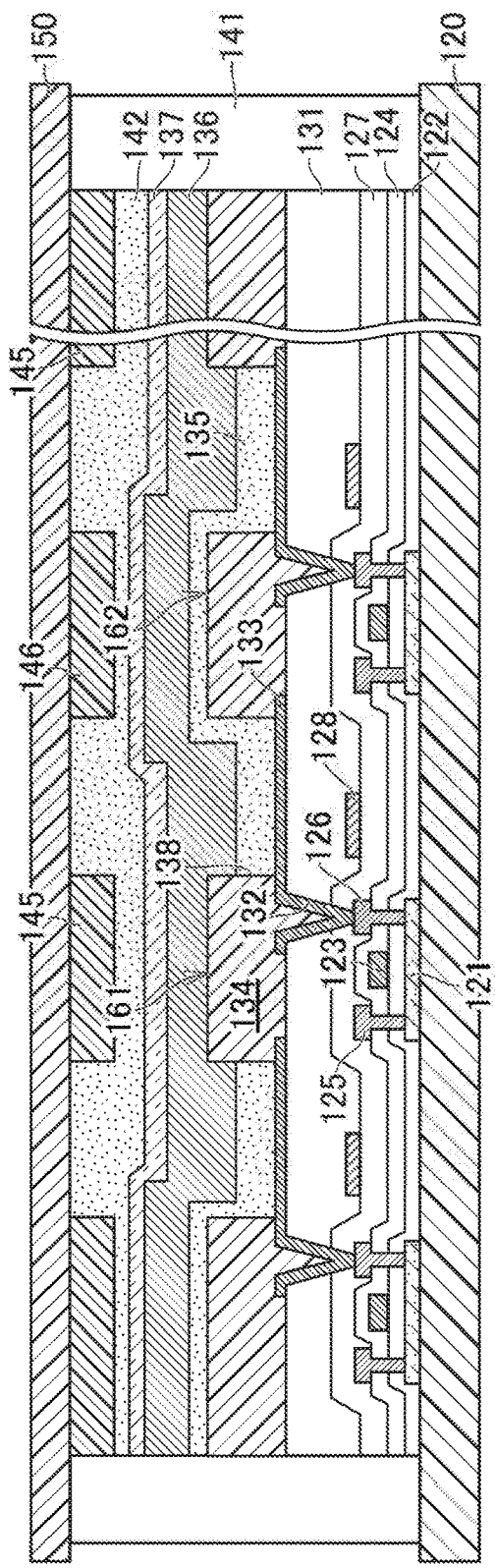
FIG. 7 is a cross-sectional view of the organic EL display device shown in FIG. 6 taken along the line VII-VII.

FIG. 6 is a partial plan view of a configuration in the display area 205 of the organic EL display device 100 according to second embodiment. FIG. 7 is a cross-sectional view of the organic EL display device 100 shown in FIG. 6 taken along the line VII-VII. In FIG. 6, the display area 205 has a stripes arrangement in which a red pixel 210r, a green pixel 210g, and a blue pixel 210b are sequentially aligned in a direction from left to right in FIG. 6. Each pixel 210 is rectangular. Further, the organic EL films 135 constituting the red pixel 210r, the green pixel 210g, and the blue pixel 210b are disposed inside of through holes 138 respectively formed at least at the positions of the pixels 210r, 210g, and 210b. The organic EL film 135 is also located on the upper surface of the insulating bank 134, which is between two through holes 138 at positions of two adjacent pixels 21 (e.g., pixels 210r and 210g in the left of FIG. 6) in an adjacent direction (lateral direction in FIG. 6). The through holes 138 are arranged adjacent to one another, and, in the following, such through holes 138 arranged adjacent to one another are referred to as "continuous holes", and adjacent pixels 210 corresponding to the positions of the holes are referred to as "continuous pixels." The organic EL film 135 may be disposed between the through holes 138 (continuous holes), which are at the positions of three or more adjacent pixels 210 (continuous pixels) in its adjacent direction and on the upper surface of the insulating bank 134. One point may be formed of four sub-pixels (red, green, blue, white).

The stripe-shaped spacers 145 and 146 are disposed on the array substrate 120 side of the counter substrate 150 in a plan view so as to avoid the through holes 138. The spacers 145 and 146 extend in a direction orthogonal to the adjacent direction. The spacers 145 and 146 respectively form protrusions on the counter substrate 150 toward the array substrate 120. The spacers 145 are disposed to sandwich the continuous holes in a plan view. Further, areas that are upper surfaces of the insulating bank 134 and placed at the positions to sandwich the continuous holes are referred to as first areas 161. The spacer 145 is disposed to oppose the first area. The organic EL film 135 is not located on the first areas 161.

The spacers 146 are disposed between the continuous holes sandwiched by two first areas 161 in a plan view. Further, areas that are upper surfaces of the insulating bank 134 and placed between the through holes 138 included in the continuous holes sandwiched by two first areas 161 are referred to as second areas 162. The spacer 146 is disposed to oppose the second area 162. The organic EL film 135 is located on the second area 162. The thickness of the spacer 145 is the same as the thickness of the spacer 146.

Similarly in the example of FIG. 7, in the first area 161, the insulating bank 134 on the array substrate 120 is adhered to the counter substrate 150 not through the organic EL film 135. This can reduce the force to delaminate the organic EL film 135 when the force to bend the organic EL display device 100 is applied, and thereby preventing the organic EL film 135 from being delaminated. In addition, it is possible to have a choice of a shape of a fine metal mask used for forming each layer included in the organic EL film 135 by vapor deposition.

Figure 8:
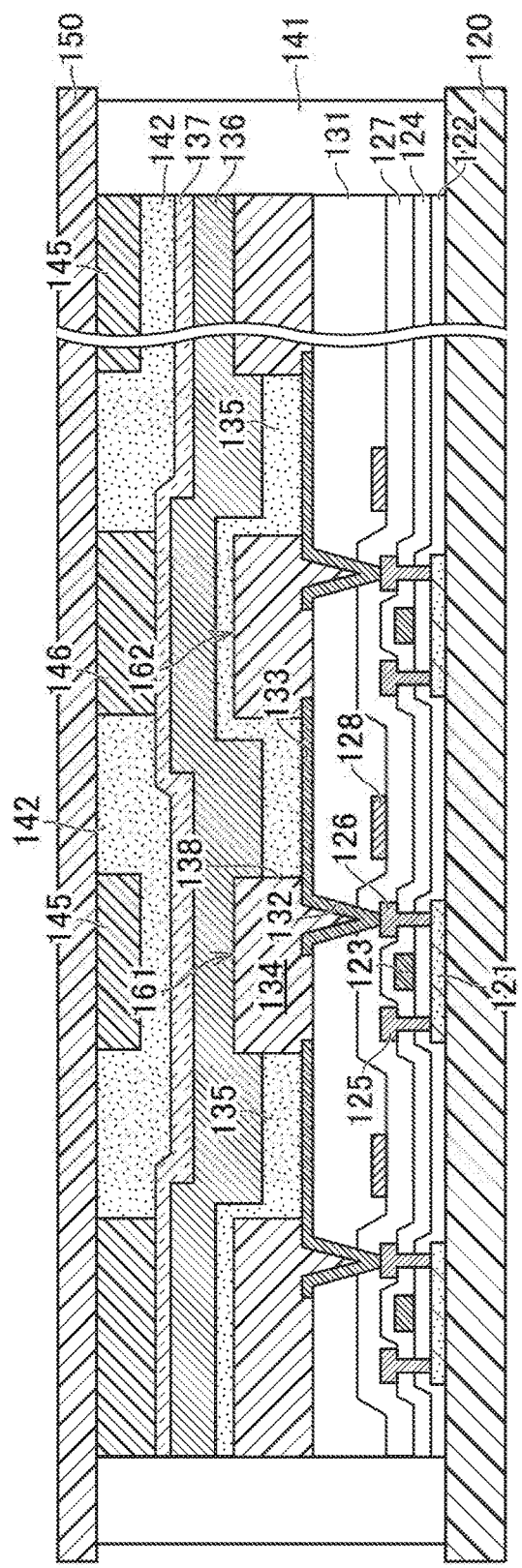
FIG. 8 is a cross-sectional view illustrating one of the other examples of the organic EL display device.

FIG. 8 is a cross-sectional view illustrating one of the other examples of the organic EL display device 100. The major difference between the examples of FIG. 8 and FIG. 7 is a difference between the thickness of the spacer 145 and the thickness of the spacer 146. In the following, the difference between the examples of FIG. 8 and FIG. 7 will be mainly discussed. In the example of FIG. 8, the spacer 145 opposing to the first area 161 is thicker than the spacer 146 opposing to the second area 162. The filler 142 is located between the spacer 145 and the sealing film 137, but is not located between the spacer 146 and the sealing film 137, and thus the spacer 146 and the sealing film 137 are directly in contact with each other. The filler 142 is located to avoid areas on the second area 162, and the spacer 146 and the sealing film 137 are not adhered together in the second area 162. As such, it is possible to prevent not only the organic EL film 135 inside of the through hole 138 but also the organic EL film 135 on the second area 162 from being directly applied with the force in a vertical direction. This further reduces the delamination of the organic EL film 135 than the example of FIG. 7.

Figure 9:
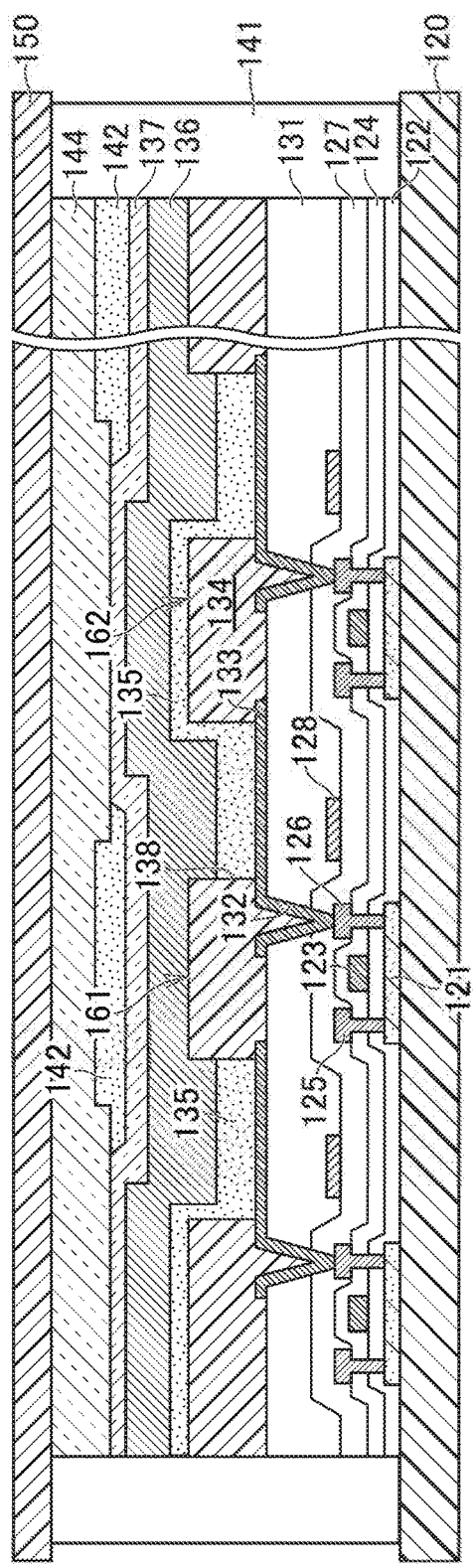
FIG. 9 is a cross-sectional view illustrating one of the other examples of the organic EL display device.

FIG. 9 is a cross-sectional view illustrating one of the other examples of the organic EL display device 100. The major difference between the examples of FIGS. 9 and 8 is that a transparent layer 144 which has a groove 147 is located instead of the spacers 145 and 146. The groove 147 is located on the first area 161 in place of the spacer 145 as in FIG. 8. The groove 147 is not located on the second area 162. The filler 142 is located between the transparent layer 144 and a part of the sealing film 137 on the first area 161. The filler 142 is filled into a space that includes the inside of the groove 147. On the other hand, an area of the transparent layer 144, which has no groove 147, and the sealing film 137 are directly in contact with each other. The filler 142 is provided to avoid areas on the second area 162, and the transparent layer 144 is not adhered to the part of the sealing film 137 placed on the second area 162. As such, it is possible to prevent not only the organic EL film 135 inside of the through hole 138 but also the organic EL film 135 on the second area 162 from being directly applied the force in a vertical direction. This further reduces the delamination of the organic EL film 135 than the example of FIG. 7.

What is claimed is:

1. A display device comprising:
    a plurality of pixel electrodes;
    an insulating layer that includes a plurality of through holes each overlapping each of the pixel electrodes and covers a periphery of each of the pixel electrodes;
    a light-emitting layer over at least one of the pixel electrodes;
    a common electrode on the insulating layer and the light-emitting layer;
    a sealing layer that seals the light-emitting layer and located on the common electrode;
    a counter substrate; and
    an adhesive layer that adheres the counter substrate to the sealing layer, wherein
    the insulating layer has a lower surface contacting the periphery of each of the pixel electrodes, a side surface intersecting the lower surface, and an upper surface intersecting the side surface and facing the lower surface,
    the upper surface of the insulating layer has a first area which does not overlap the light-emitting layer in a plan view, and
    the adhesive layer is located at least on the first area.
2. The display device according to claim 1, wherein
    the light-emitting layer is located inside of the through holes and is not located on the upper surface, and
    the adhesive layer is located on an entirety of the upper surface.
3. The display device according to claim 1, wherein
    the upper surface has a second area which is different from the first area, and
    the light-emitting layer is located inside of the through holes and on the second area.
4. The display device according to claim 3, wherein
    the second area does not overlap the light-emitting layer in a plan view.
5. The display device according to claim 3, wherein
    the first area sandwiches more than one of the through holes, the more than one of the through holes being adjacent to one another, and
    the second area is located between the more than one of the through holes.
6. The display device according to claim 1, wherein
    the counter substrate includes a plurality of first protrusions that oppose to the first area so as not to oppose the through holes.
7. The display device according to claim 6, wherein
    the first protrusions are formed in a stripe shape.
8. The display device according to claim 6, wherein
    the first protrusions are spacers that are formed on the counter substrate with a same material as the insulating layer.
9. The display device according to claim 3, wherein
    the counter substrate includes first protrusions and second protrusions, the first protrusions opposing to the first area so as not to oppose to the through holes, the second protrusions opposing to the second area so as not to oppose to the through holes.
10. The display device according to claim 9, wherein
    the adhesive layer is located, on the first area, between the first protrusions and the sealing layer, and
    the second protrusions are in contact with the sealing layer on the second area.
11. The display device according to claim 1, further comprising a light-transmitting layer that is located between the counter substrate and the adhesive layer.
12. The display device according to claim 1, wherein
    the counter substrate is formed of resin.
13. A display device comprising:
    a first substrate;
    a plurality of pixel electrodes on the first substrate,
    an insulating layer that includes a plurality of through holes each overlapping each of the pixel electrodes and covers a periphery of each of the pixel electrodes;
    a light-emitting layer over at least one of the pixel electrodes;
    a common electrode on the insulating layer and the light-emitting layer;

a sealing layer on the common electrode;
a second substrate that opposes to the first substrate; and
an adhesive layer between the second substrate and the sealing layer, wherein
the insulating layer has a lower surface contacting the periphery of each of the pixel electrodes, a side surface intersecting the lower surface, and an upper surface intersecting the side surface and facing the lower surface,
the upper surface of the insulating layer has a first area that does not overlap the light-emitting layer in a plan view, and
the adhesive layer is located on the first area.

14. The display device according to claim 13, wherein the first substrate and the second substrate are formed of resin.

15. The display device according to claim 13, wherein
the upper surface has a second area which is different from the first area, and
the light-emitting layer is located inside of the through holes and on the second area.

16. The display device according to claim 13, wherein the second substrate includes a protrusion that opposes to the first area so as not to oppose to the through holes.

* * * * *